(12) United States Patent
Kodama et al.

(10) Patent No.: US 9,406,395 B1
(45) Date of Patent: Aug. 2, 2016

(54) NONVOLATILE SEMICONDUCTOR MEMORY DEVICE

(71) Applicant: KABUSHIKI KAISHA TOSHIBA, Minato-ku (JP)

(72) Inventors: Takuyo Kodama, Sagamihara (JP); Masahiro Hosoya, Yokohama (JP); Tomoyuki Hamano, Yokohama (JP)

(73) Assignee: KABUSHIKI KAISHA TOSHIBA, Minato-ku (JP)

( * ) Notice: Subject to any disclaimer, the term of this patent is extended or adjusted under 35 U.S.C. 154(b) by 0 days.

(21) Appl. No.: 14/844,684

(22) Filed: Sep. 3, 2015

Related U.S. Application Data

(60) Provisional application No. 62/130,981, filed on Mar. 10, 2015.

(51) Int. Cl.
*G11C 16/34* (2006.01)
*G11C 16/30* (2006.01)

(52) U.S. Cl.
CPC ............ *G11C 16/3459* (2013.01); *G11C 16/30* (2013.01)

(58) Field of Classification Search
USPC .............. 365/185.22, 185.29, 185.33, 185.17
See application file for complete search history.

(56) References Cited

U.S. PATENT DOCUMENTS

| | | | | |
|---|---|---|---|---|
| 7,965,555 B2* | 6/2011 | Namiki | ............. | G11C 16/0483 365/185.17 |
| 2013/0265841 A1* | 10/2013 | Duzly | ...................... | G11C 5/14 365/228 |
| 2013/0279255 A1* | 10/2013 | Kamata | .................. | G11C 16/26 365/185.11 |

FOREIGN PATENT DOCUMENTS

JP        2008-34045 A     2/2008

* cited by examiner

*Primary Examiner* — Hoai V Ho
*Assistant Examiner* — Minh Dinh
(74) *Attorney, Agent, or Firm* — Oblon, McClelland, Maier & Neustadt, L.L.P

(57) ABSTRACT

According to one embodiment, a nonvolatile semiconductor memory device includes a first memory cell and a controller. The controller controls a write operation. The write operation includes a first program to write data into the first memory cell, and a first verification to verify the first program. when a power voltage has become lower than a first voltage during the execution of the first verification for the first memory cell, the controller executes a second verification to verify the first program for the first memory cell.

20 Claims, 8 Drawing Sheets

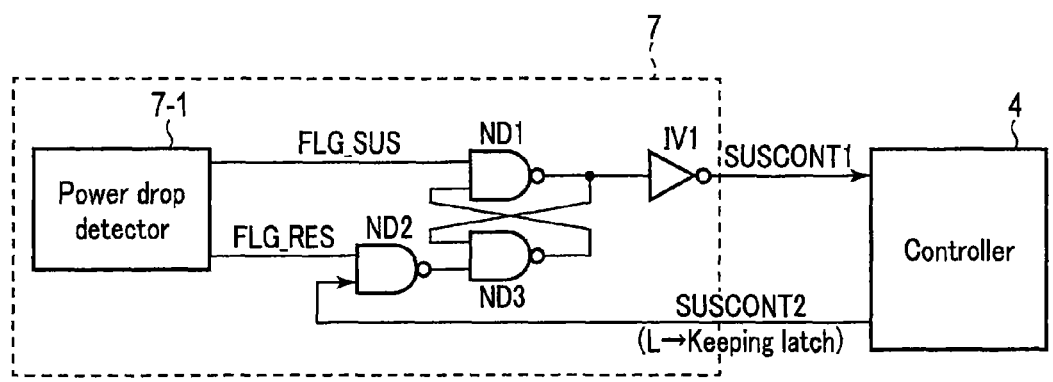
F I G. 2

NONVOLATILE SEMICONDUCTOR MEMORY DEVICE

CROSS-REFERENCE TO RELATED APPLICATIONS

This application claims the benefit of U.S. Provisional Application No. 62/130,981, filed Mar. 10, 2015, the entire contents of which are incorporated herein by reference.

FIELD

Embodiments described herein relate generally to a nonvolatile semiconductor memory device.

BACKGROUND

Recently, in a nonvolatile semiconductor memory device such as a NAND flash memory, a write operation is performed in loops including a program and a program verification. For example, if a power voltage drops during the period of the program verification, a verification result may be an erroneous judgment. If the erroneous judgment occurs in the program verification, troubles occur; a program is repeated for a memory cell which has already completed a program (over-program), or the transition is made to the program of a next memory cell even though a program has not been completed. In this case, for example, error detection and correction (ECC) is used to correct written data.

BRIEF DESCRIPTION OF THE DRAWING

FIG. 2 is a circuit diagram showing the configuration of a voltage controller in the nonvolatile semiconductor memory device according to the first embodiment;

DETAILED DESCRIPTION

Hereinafter, a nonvolatile semiconductor memory device according to an embodiment will be described below with reference to the drawings. In the following explanation, components having the same functions and configurations are provided with the same reference signs and are only described repeatedly when necessary. Embodiments described below illustrate apparatuses and methods that embody the technical concept of the embodiments, and do not specify the materials, shapes, structures, and locations of the components to those described below.

In general, according to one embodiment, a nonvolatile semiconductor memory device includes a first memory cell and a controller. The controller controls a write operation. The write operation includes a first program to write data into the first memory cell, and a first verification to verify the first program. When a power voltage has become lower than a first voltage during the execution of the first verification for the first memory cell, the controller executes a second verification to verify the first program for the first memory cell.

In the following embodiments, a NAND flash memory is described as an example of a nonvolatile semiconductor memory device.

First Embodiment

A nonvolatile semiconductor memory device according to the first embodiment is described.

1. Overall Configuration

Figure 1:
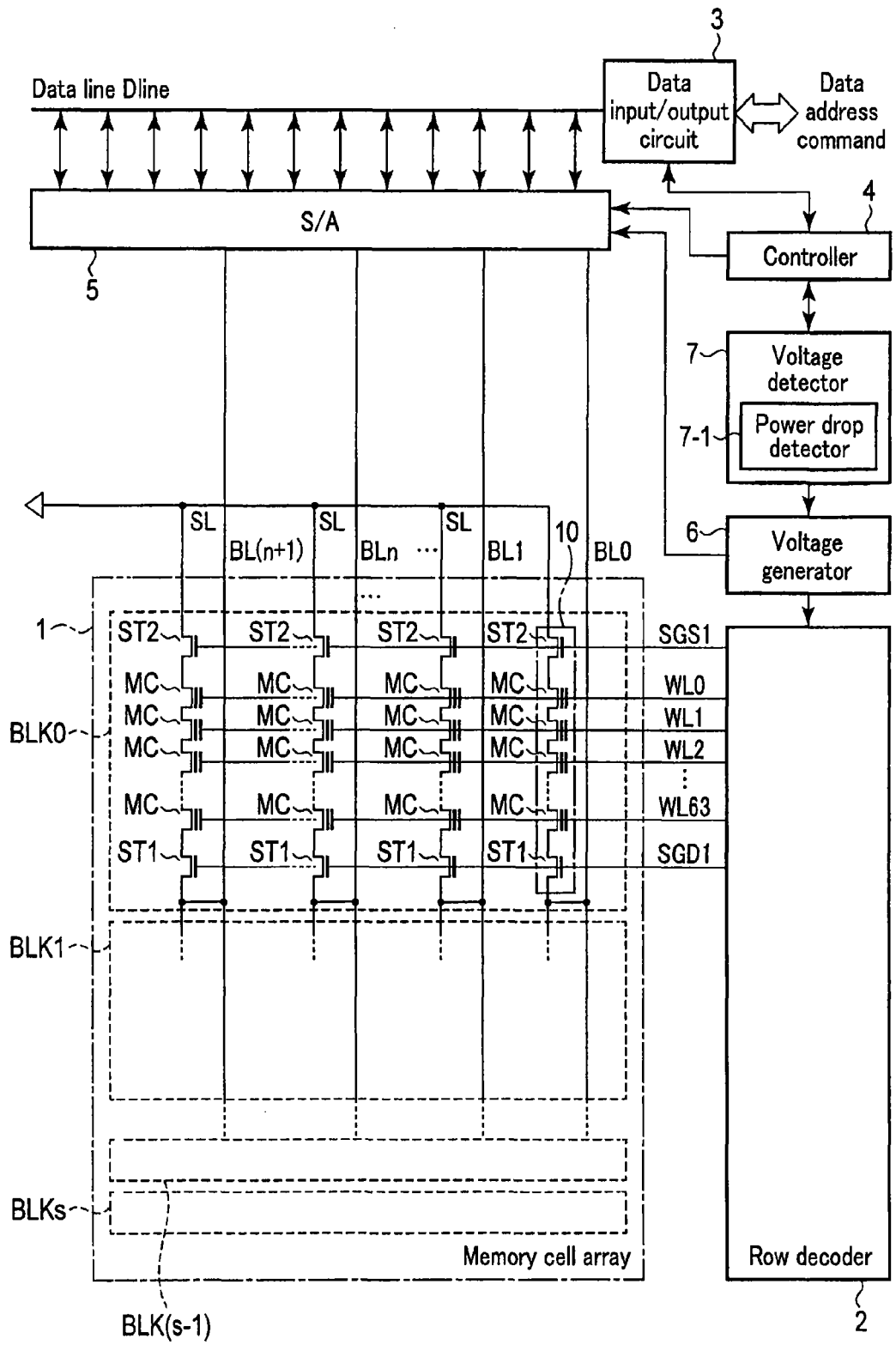
FIG. 1 is a block diagram showing the overall configuration of a nonvolatile semiconductor memory device according to a first embodiment.

FIG. 1 is a block diagram showing the overall configuration of the nonvolatile semiconductor memory device according to the first embodiment. The nonvolatile semiconductor memory device according to the present embodiment includes a memory cell array 1, a row decoder 2, a data input/output circuit 3, a controller 4, a sense amplifier (S/A) 5, a voltage generating circuit 6, and a voltage detecting circuit 7.

1.1 Memory Cell Array 1

The memory cell array 1 includes blocks BLK0 to BLKs (s is a natural number equal to or more than 0). Each of the blocks BLK0 to BLKs includes NAND strings 10 in which nonvolatile memory cells MC are connected in series. Each of the NAND strings 10 includes, for example, 64 memory cells MC connected in series, and select transistors ST1 and ST2. To simplify the explanation, each of the blocks BLK0 to BLKs is hereinafter simply referred to as block BLK when not distinguished.

The memory cells MC are capable of holding data having two or more values. The structure of each of the memory cells MC includes a floating gate (charge conducting layer) formed on a p-type semiconductor substrate via a gate insulating film, and a control gate formed on the floating gate via an inter-gate insulating film. The structure of the memory cell MC may be a MONOS type. The MONOS type is a structure having a charge storage layer (e.g., insulating film) formed on a semiconductor substrate via a gate insulating film, an insulating film (hereinafter referred to as a block layer) which is formed on the charge storage layer and which is higher in dielectric constant than the charge storage layer, and a control gate formed on the block layer.

The memory cell MC has the control gate electrically connected to a word line, a drain electrically connected to a bit line, and a source electrically connected to a source line. The memory cell MC is an n-channel MOS transistor. The number of the memory cells MC is not limited to 64, and may be, for example, 128, 256, or 512. The number is not limited.

The adjacent memory cells MC share the source and the drain. The memory cells MC are disposed so that the current paths thereof are connected in series between the select transistors ST1 and ST2. The drain at one end of the memory cells MC connected in series is connected to the source of the select transistor ST1, and the source at the other end is connected to the drain of the select transistor ST2.

The control gates of the memory cells MC in the same row are connected to the same one of word lines WL0 to WL63, and the gate electrodes of the select transistors ST1 and ST2 in the same row are connected to the same select gate lines SGD1 and SGS1. Hereinafter, each of the word lines WL0 to WL63 is simply referred to as word line WL when not distinguished.

The drains of the select transistors ST1 in the same column in the memory cell array 1 are connected to the same ones of bit lines BL0 to BL(n+1). Hereinafter, each of the bit lines BL0 to BL(n+1) is also collectively referred to as bit line BL when not distinguished (n is a natural number equal to or more than 0). The sources of the select transistors ST2 are connected to the same source line SL.

Data are collectively written into the memory cells MC connected to the same word line WL, and this unit is referred to as a page. Moreover, data are collectively erased in the memory cells MC by the blocks BLK.

1.2 Peripheral Circuits

Returning to FIG. 1, peripheral circuits are described next.

1.2.1 Row Decoder 2

The row decoder 2 decodes a block selection signal provided from the controller 4 during a data writing operation, during a read operation, and during erasing, and selects a block BLK accordingly. The row decoder 2 then transfers one of a write voltage, a read voltage, and an erase voltage to each of the word lines WL in the selected block BLK.

Specifically, the row decoder 2 transfers a write voltage VPGM as the write voltage to the memory cell MC targeted for writing, and transfers a voltage VPASS to other unselected memory cells MC.

The row decoder 2 transfers a read voltage VCGR as the read voltage to the memory cell MC targeted for reading, and transfers a voltage VREAD to other unselected memory cells MC.

During erasing, the row decoder 2 transfers a zero voltage to all the word lines WL which pass through the selected block BLK. In this instance, a positive high voltage is applied to the semiconductor substrate (well region) in which the memory cells MC are arranged.

1.2.2 Data Input/Output Circuit 3

The data input/output circuit 3 outputs, to the controller 4, an address and a command supplied from a host via an unshown I/O terminal. The data input/output circuit 3 also outputs write data to the sense amplifier 5 via a data line Dline. When outputting data to the host, the data input/output circuit 3 receives data amplified by the sense amplifier 5 via the data line Dline under the control of the controller 4, and then outputs the data to the host via the I/O terminal.

1.2.3 Controller 4

The controller 4 controls the overall operation of the NAND flash memory. That is, the controller 4 executes an operation sequence in the data writing operation, reading operation, and erasing operation in accordance with the address and the command supplied from the unshown host via the data input/output circuit 3. The controller 4 generates a block selection signal/column selection signal in accordance with the address and the operation sequence. The controller 4 outputs the above-mentioned block selection signal to the row decoder 2. The controller 4 also outputs the column selection signal to the sense amplifier 5. The column selection signal is a signal for selecting a column direction of the sense amplifier 5.

A control signal supplied from an unshown memory controller is provided to the controller 4. The controller 4 determines by the supplied control signal whether the signal supplied to the data input/output circuit 3 from the host via the unshown I/O terminal is an address or data. The controller 4 also controls the timing of signal supply to the transistors constituting the sense amplifier 5.

1.2.4 Sense Amplifier 5

During data reading, the sense amplifier 5 passes a constant current to the bit lines BL, and directly senses a current running through the memory cell MC after the potential of the bit lines BL has been stabilized. Thus, the sense amplifier 5 can collectively read from all the bit lines BL. The value of the current running through the bit lines BL is determined by the data retained in the memory cell MC. That is, "1" or "0" is determined by the sense amplifier 5 connected to the bit lines BL in accordance with the difference of a current value running through this memory cell MC. During data programming, the sense amplifier 5 transfers write data to the corresponding bit line BL.

1.2.5 Voltage Generating Circuit 6

The voltage generating circuit 6 receives a power voltage VCC from the outside, generates the voltage VPGM, the voltage VPASS, the voltage VCGR, the voltage VREAD, and a voltage VERA in accordance with the controller 4, and supplies these voltages to the row decoder 2.

1.2.6 Voltage Detecting Circuit 7

FIG. 2 is a circuit diagram showing the configuration of the voltage detecting circuit 7.

The voltage detecting circuit 7 includes a power drop detector 7-1, NAND circuits ND1, ND2, and ND3, and an inverter IV1. The NAND circuits ND1 and ND3 constitute a latch circuit. The voltage detecting circuit 7 detects the voltage of the power voltage VCC, and outputs a control signal in accordance with a detection result. The voltage detecting circuit is controlled by the controller 4.

The power drop detector 7-1 detects the drop of the power voltage VCC supplied from the outside, and the recovery of the power voltage VCC. The power drop detector 7-1 is controlled by the controller 4. Hereinafter, the drop of the power voltage VCC may be referred to as a power drop.

A suspend operation set signal FLG_SUS output from the power drop detector 7-1 is supplied to a first input terminal of the NAND circuit ND1. A suspend operation reset signal FLG_RES output from the power drop detector 7-1 is supplied to a first input terminal of the NAND circuit ND2.

An output terminal of the NAND circuit ND1 is supplied to the controller 4 via the inverter IV1, and connected to a first input terminal of the NAND circuit ND3. An output terminal of the NAND circuit ND2 is connected to a second input terminal of the NAND circuit ND3. An output terminal of the NAND circuit ND3 is connected to a second input terminal of the NAND circuit ND1. A suspend control signal SUSCONT1 is supplied to the controller 4 from the output terminal of the NAND circuit ND1 via the inverter IV1. A suspend control signal SUSCONT2 is supplied to a second input terminal of the NAND circuit ND2 from the controller 4.

The power drop detector 7-1 detects the voltage level of the power voltage VCC, and outputs the suspend operation set signal FLG_SUS and the suspend operation reset signal FLG_RES corresponding to the voltage level to the NAND circuits ND1 and ND2, respectively. The NAND circuit ND1 outputs the suspend control signal SUSCONT1 to the controller 4. Further, the controller 4 outputs the suspend control signal SUSCONT2 to the NAND circuit ND2.

The suspend operation reset signal FLG_RES is low during a period in which the voltage level of the power voltage VCC is dropped, for example, during a period in which the power voltage VCC is a voltage lower than 70%. If the voltage level of the power voltage VCC becomes lower than 70%, the suspend operation reset signal FLG_RES becomes "L" from "H (high)". If the voltage level of the power voltage VCC becomes 70% or more later, the suspend operation reset signal FLG_RES becomes "H" from "L". For example, the voltage level which is 70% of the power voltage VCC is a voltage to prepare for the case where the power voltage VCC becomes lower than a later-described voltage level of 50%.

The suspend operation set signal FLG_SUS is "L", for example, during a period in which the voltage level of the power voltage VCC is lower than 50%. If the voltage level of the power voltage VCC becomes lower than 50%, the suspend operation set signal FLG_SUS becomes "L" from "H". If the voltage level of the power voltage VCC becomes 50% or more later, the suspend operation set signal FLG_SUS becomes "H" from "L". For example, the voltage level which is 50% of the power voltage VCC is a voltage (operation guarantee voltage) to guarantee all the operations including the write operation in the nonvolatile semiconductor memory device. When the voltage level of the power voltage VCC is lower than 50%, the write operation is not normally performed.

A sense signal DET is a signal which becomes "H" during a sense period in the program verification. The sense period is a period in which data is read and transferred from the memory cell. The suspend control signal SUSCONT1 is a signal which becomes "L" synchronously with the change of the suspend operation set signal FLG_SUS to "L" and which finishes a suspend mode if this signal becomes "H". The suspend mode will be described later. The suspend control signal SUSCONT2 is a signal which becomes "L" synchronously with the change of the sense signal DET to "H" and which does not become "H" only when detecting that the suspend operation set signal FLG_SUS has become "L" even if the sense signal DET becomes "L" and which becomes "H" at the end of the program verification operation.

1.3 Write Operation

Figure 3:
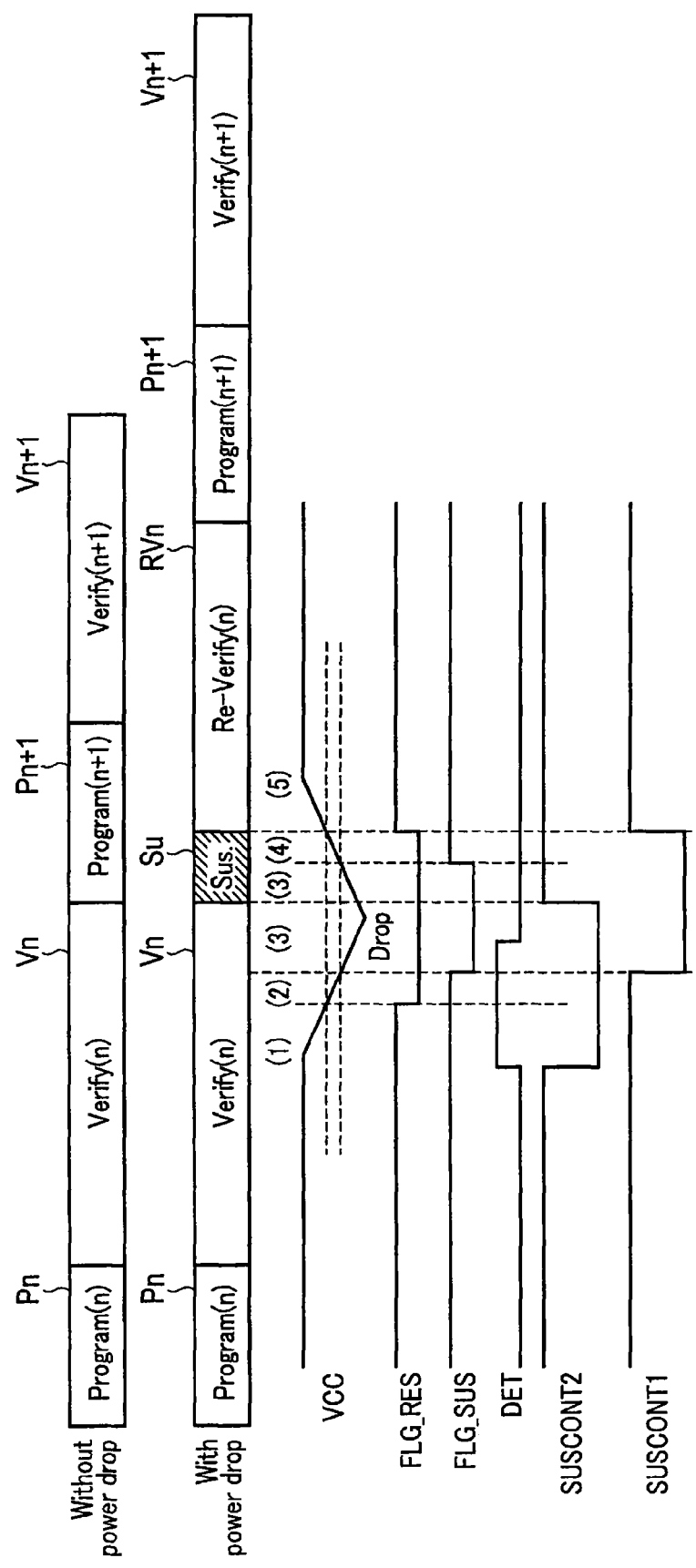
FIG. 3 is a timing chart of a write operation in the nonvolatile semiconductor memory device according to the first embodiment.

FIG. 3 is a timing chart for the write operation in the first embodiment, and shows the write operations in the case where the power drop detector 7-1 detects a power drop and in the case where the power drop detector 7-1 does not detect a power drop. (1) to (5) in FIG. 3 correspond to (1) to (5) in FIG. 4 described later.

In the write operation, for example, a loop including the program and the program verification is repeated for the memory cells until the program verification passes. In the case described here, a program corresponding to a loop n is executed, and the program verification corresponding to this loop n does not pass, and is followed by a program corresponding to a loop n+1. The program corresponding to the loop n refers to a program of an n-th loop, and the program verification corresponding to the loop n refers to a program verification of the n-th loop. Here, n represents any loop number, and is a natural number equal to or more than 1.

1.3.1 Overview of Write Operation

The following is the case where the power drop detector 7-1 does not detect a power drop of the power voltage VCC, that is, the power drop detector 7-1 does not detect that the power voltage VCC is lower than the operation guarantee voltage. The controller 4 executes a program Pn corresponding to the loop n, and then executes a program verification Vn corresponding to the loop n. When this verification is not passed, a program Pn+1 corresponding to the loop n+1 is executed. Then a program verification Vn+1 corresponding to the loop n+1 is executed.

In contrast, the following is the case where the power drop detector 7-1 detects a power drop of the power voltage VCC. The controller 4 executes the program Pn corresponding to the loop n, and then executes the program verification Vn corresponding to the loop n. When a drop of the power voltage VCC is detected during the sense period of this program verification Vn and no recovery of the power voltage VCC is detected later, a suspend mode (suspend state) Su is entered after the end of the program verification Vn. The suspend mode refers to a condition in which the write operation is suspended.

During the suspend mode, the power drop detector 7-1 detects the voltage level of the power voltage VCC, and finishes the suspend mode if the power voltage VCC recovers to 70% or more. After the end of the suspend mode, a program verification RVn corresponding to the loop n is again executed.

When this program verification RVn is not passed later, a program Pn+1 corresponding to the loop n+1 is executed. Then the program verification Vn+1 corresponding to the loop n+1 is executed. Conversely, when the program verification RVn has been passed, the controller 4 shifts to the loop for the next memory cell.

1.3.2 Details of Write Operation

Figure 4:
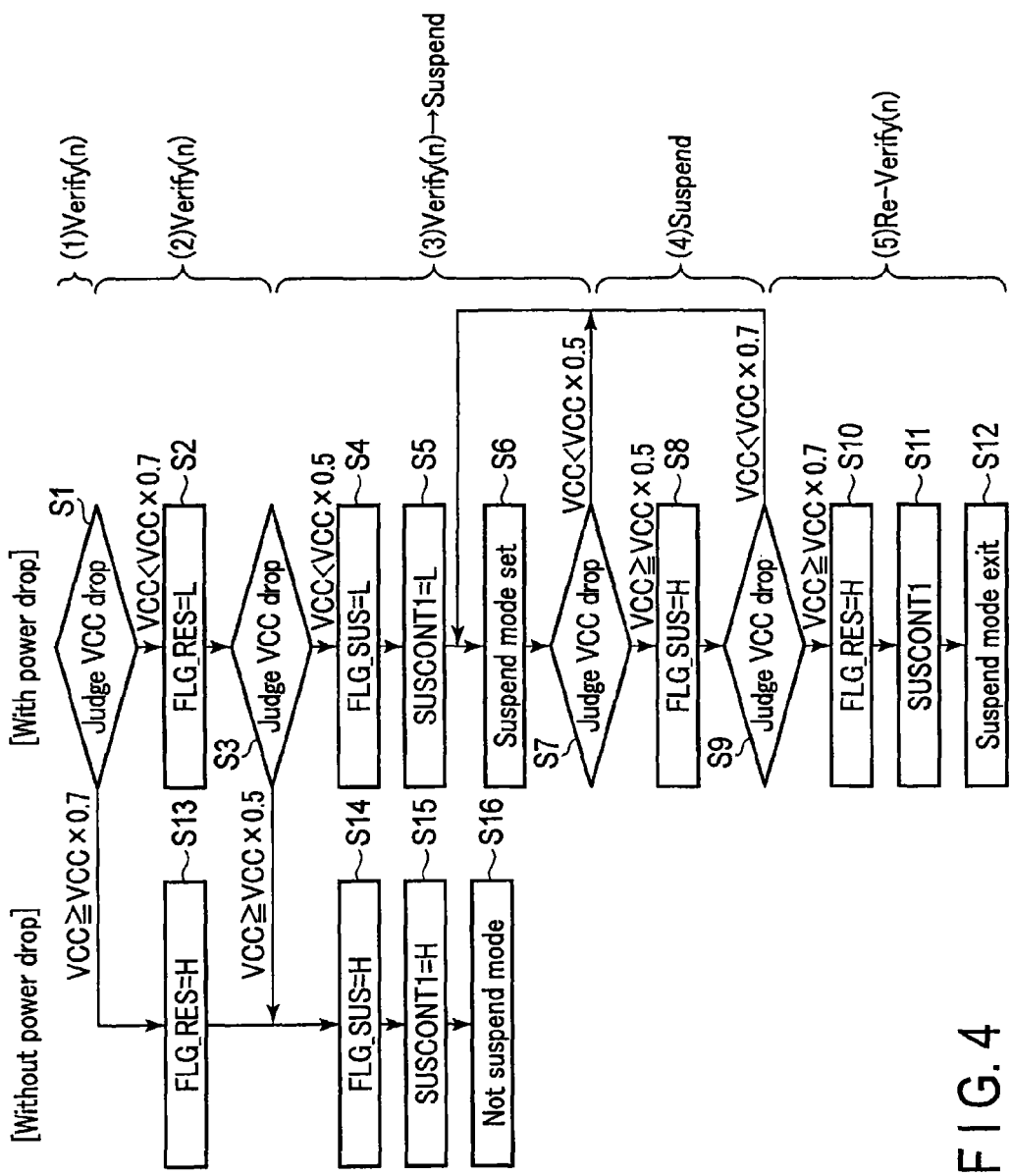
FIG. 4 is a flowchart of the write operation in the nonvolatile semiconductor memory device according to the first embodiment.

FIG. 4 is a flowchart showing the details of the write operation.

First, the controller 4 (including the power drop detector 7-1) judges whether the power voltage VCC has dropped. Here, whether the power voltage VCC is a voltage lower than 70% is judged (step S1).

(Hereinafter, in the Case of a Voltage Drop)

When the power voltage VCC is a voltage lower than 70%, the controller 4 outputs "L" as the suspend operation reset signal FLG_RES (step S2). The case where the power voltage VCC is a voltage of 70% or more (where there is no voltage drop) will be described later.

The controller 4 then judges whether the power voltage VCC has further dropped. Here, whether the power voltage VCC is a voltage lower than 50% is judged (step S3). When the power voltage VCC is a voltage lower than 50%, the controller 4 outputs "L" as the suspend operation set signal FLG_SUS (step S4). Further, the controller 4 outputs "L" as the suspend control signal SUSCONT1 (step S5).

Since the suspend operation set signal FLG_SUS is "L" and the suspend control signal SUSCONT1 is "L", the controller 4 sets the write operation to the suspend mode (step S6). As a result, the write operation is suspended.

The controller 4 then judges whether the voltage level of the power voltage VCC has recovered. Here, whether the power voltage VCC is a voltage of 50% or more is judged (step S7). When the power voltage VCC is a voltage lower than 50%, the controller 4 returns to step S6, and continues the suspend mode. Conversely, when the power voltage VCC is a voltage of 50% or more, the controller 4 outputs "H" as the suspend operation set signal FLG_SUS (step S8).

The controller 4 then judges whether the voltage level of the power voltage VCC has further recovered. Here, whether the power voltage VCC is a voltage of 70% or more is judged (step S9). When the power voltage VCC is a voltage lower than 70%, the controller 4 returns to step S6, and continues the suspend mode. Conversely, when the power voltage VCC is a voltage of 70% or more, the controller 4 outputs "H" as the suspend operation reset signal FLG_RES (step S10). The controller 4 further outputs "H" as the suspend control signal SUSCONT1 (step S11).

Since the suspend operation reset signal FLG_RES is "H" and the suspend control signal SUSCONT1 is "H", the controller 4 escapes from the suspend mode (step S12) and returns to the write operation.

Subsequently, in the write operation, the program verification Vn corresponding to the loop n which is targeted for the program verification before the write operation is suspended by the suspend mode is again executed. In response to the result of the program verification Vn, when the verification has failed, the program Pn+1 corresponding to the loop n+1 is executed. When the verification has been passed, a write operation for the next memory cell is performed.

(Hereinafter, in the Case of No Voltage Drop)

When the power voltage VCC is a voltage of 70% or more in step S1, the controller 4 outputs "H" as the suspend operation reset signal FLG_RES (step S13). The controller 4 further outputs "H" as the suspend operation set signal FLG_SUS (step S14). The controller 4 further outputs "H" as the suspend control signal SUSCONT1 (step S15).

Since the suspend operation set signal FLG_SUS is "H" and the suspend control signal SUSCONT1 is "H", the controller 4 continues the write operation without entering the suspend mode (step S16). When the power voltage VCC is a voltage of 50% or more in step S3, the controller 4 shifts to step S14.

1.4 Advantageous Effects of the First Embodiment

In the first embodiment, when a power drop of the power voltage VCC is detected during the sense period in the first program verification corresponding to the loop n, the second program verification corresponding to the loop n is executed after the power voltage VCC has recovered after the end of the first program verification. In accordance with the result of this second program verification, whether to execute a program corresponding to the loop n+1 or shift to the loop for the next memory cell targeted for writing is determined.

Thus, even when the result of the program verification at the time of the detection of a voltage drop is a misjudgment, whether to repeat the program is determined in accordance with the result of the program verification executed after the recovery of the power voltage VCC. Therefore, it is possible to prevent the movement to the next address with an over-program or erroneous writing caused by an erroneous verification result (misjudgment).

Advantageous effects of the first embodiment are described in detail below using a comparative example shown in FIG. 5.

When the program verification corresponding to the loop n is executed and a drop of the power voltage VCC is detected during this program verification, the controller 4 enters the suspend mode if the power voltage VCC has not recovered after the end of the program verification. If the power voltage VCC has recovered, the controller 4 finishes the suspend mode, and executes the program corresponding to the loop n+1 in accordance with the result of the program verification, that is, when the verification has failed. Conversely, when the verification has been passed, the controller 4 shifts to the loop for the next memory cell targeted for writing.

In this comparative example, if the power voltage VCC drops during the sense period in the program verification, the program verification may be improperly performed, and a misjudgment may be made. For example, even though the program has been already completed, the program verification may be judged to have been failed, and an excessive program may be executed (over-program). Moreover, even though the program has not been completed, the program verification may be judged to have been passed, and the transition may be made to the program of the next address (erroneous writing).

In contrast, in the first embodiment, when a drop of the power voltage VCC is detected during the sense period in the program verification, the program verification is again executed for the same address after the power voltage VCC has recovered after the end of the program verification. Thus, the program can be executed in accordance with the correct judgment by the program verification after the recovery of the power voltage VCC.

Second Embodiment

Next, a nonvolatile semiconductor memory device according to the second embodiment is described. In the case of a write operation described in the second embodiment, a power drop occurs during a program verification, and the power voltage VCC recovers during this program verification. The overall configuration of the nonvolatile semiconductor memory device and the configurations of the voltage detecting circuit and others are similar to those in the first embodiment and are therefore not described.

1. Write Operation

Figure 6:
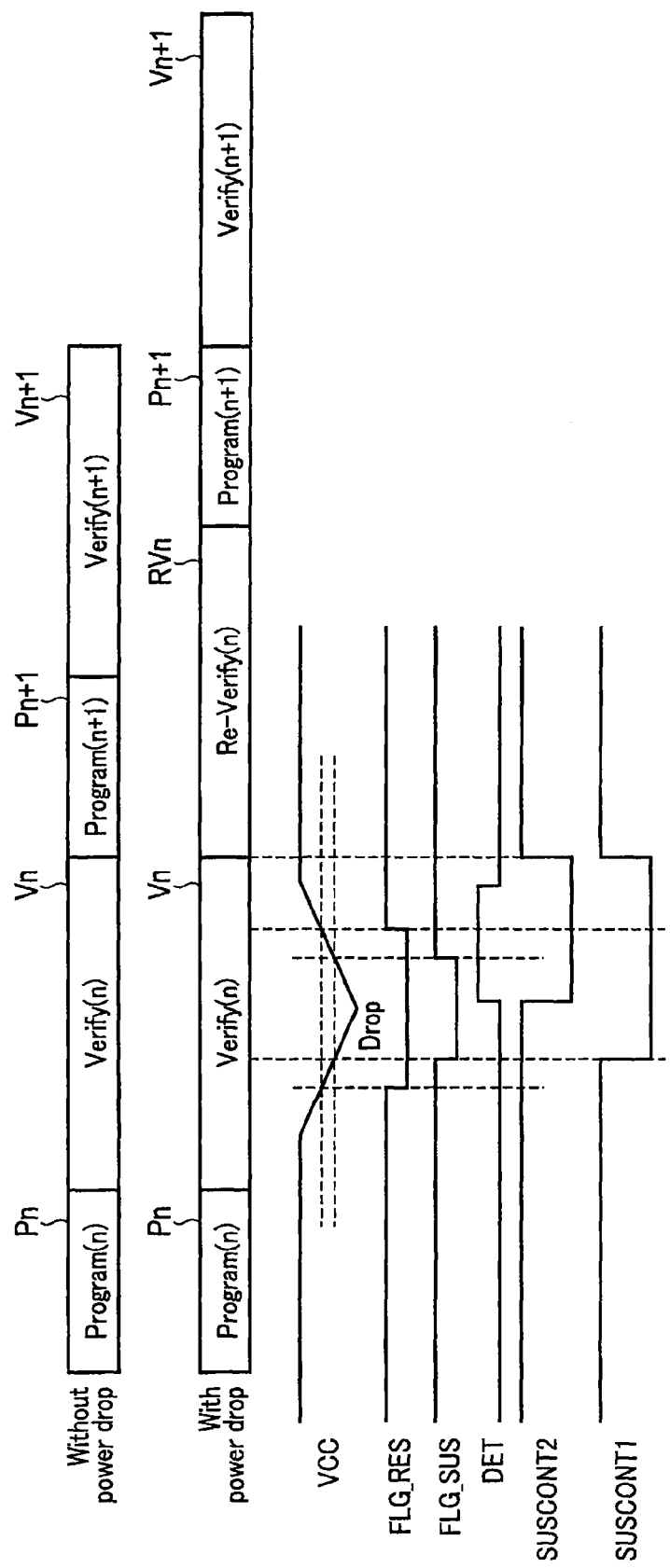
FIG. 6 is a timing chart of a write operation in a nonvolatile semiconductor memory device according to a second embodiment.

FIG. 6 is a timing chart for the write operation in the second embodiment, and shows the write operations in the case where the power drop detector 7-1 detects a power drop and in the case where the power drop detector 7-1 does not detect a power drop.

The case where the power drop detector 7-1 does not detect a power drop of the power voltage VCC is similar to that in the first embodiment described above.

The following is the case where the power drop detector 7-1 detects a power drop of the power voltage VCC. The controller 4 executes the program Pn corresponding to the loop n, and then executes the program verification Vn corresponding to the loop n. When a drop of the power voltage VCC is detected during the sense period of this program verification Vn and the recovery of the power voltage VCC is then detected during the sense period, the controller 4 again executes the program verification RVn corresponding to the loop n after the end of the program verification Vn.

When this program verification RVn is not passed, the program Pn+1 corresponding to the loop n+1 is then executed. Then the program verification Vn+1 corresponding to the loop n+1 is executed. Conversely, when the program verification RVn has been passed, the controller 4 shifts to the loop for the next memory cell.

2. Advantageous Effects of the Second Embodiment

In the second embodiment, when a power drop of the power voltage VCC and the recovery of the power voltage VCC are detected during the sense period in the first program verification corresponding to the loop n, the second program verification corresponding to the loop n is executed after the end of the first program verification. In accordance with the result of this second program verification, whether to execute a program corresponding to the loop n+1 or shift to the loop for the next memory cell targeted for writing is determined.

Thus, as in the first embodiment, it is possible to prevent the movement to the next address with an over-program or erroneous writing caused by an erroneous verification result (misjudgment).

Figure 7:
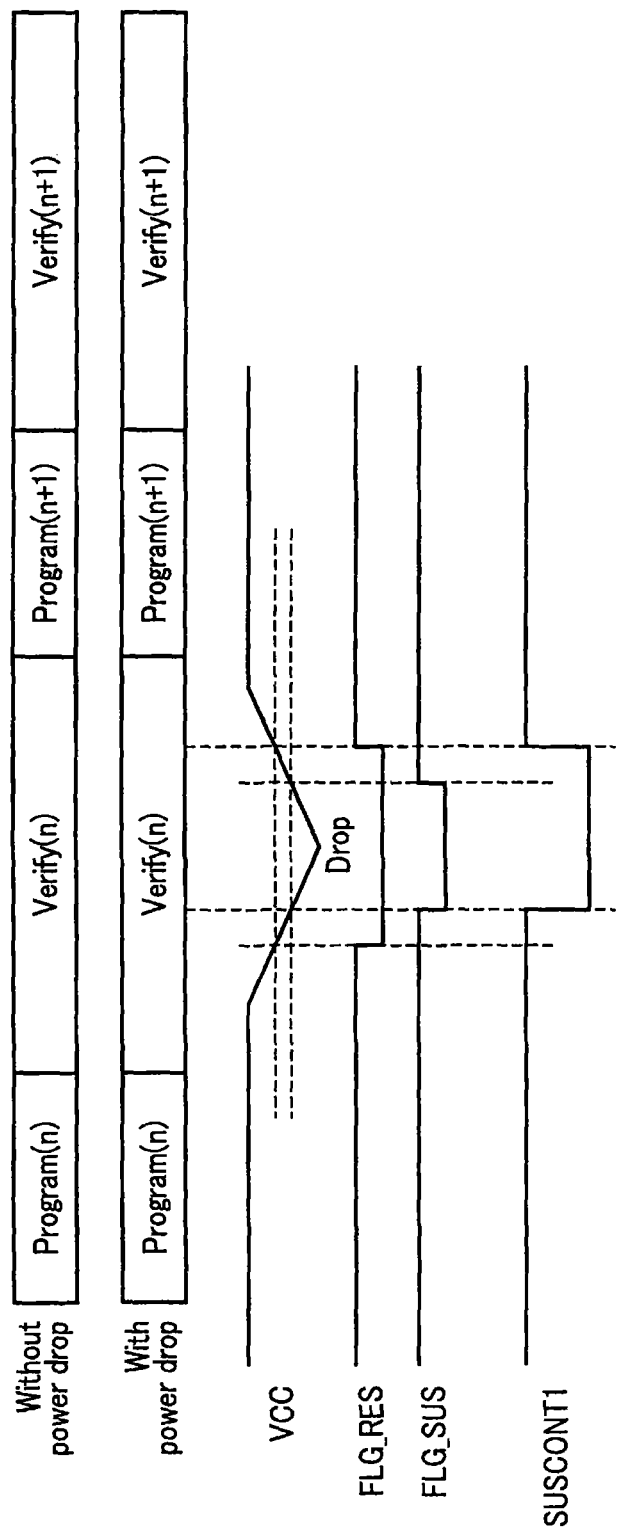
FIG. 7 is a timing chart of a write operation according to another comparative example.

Advantageous effects of the second embodiment are described in detail below using a comparative example shown in FIG. 7.

When the program verification corresponding to the loop n is executed and a drop of the power voltage VCC is detected during this program verification and then the power voltage VCC recovers, the controller 4 executes the program corresponding to the loop n+1 in accordance with the result of the program verification after the end of the program verification, that is, when the verification has failed. On the contrary, when the verification has been passed, the controller 4 shifts to the loop for the next memory cell targeted for writing.

Figure 5:
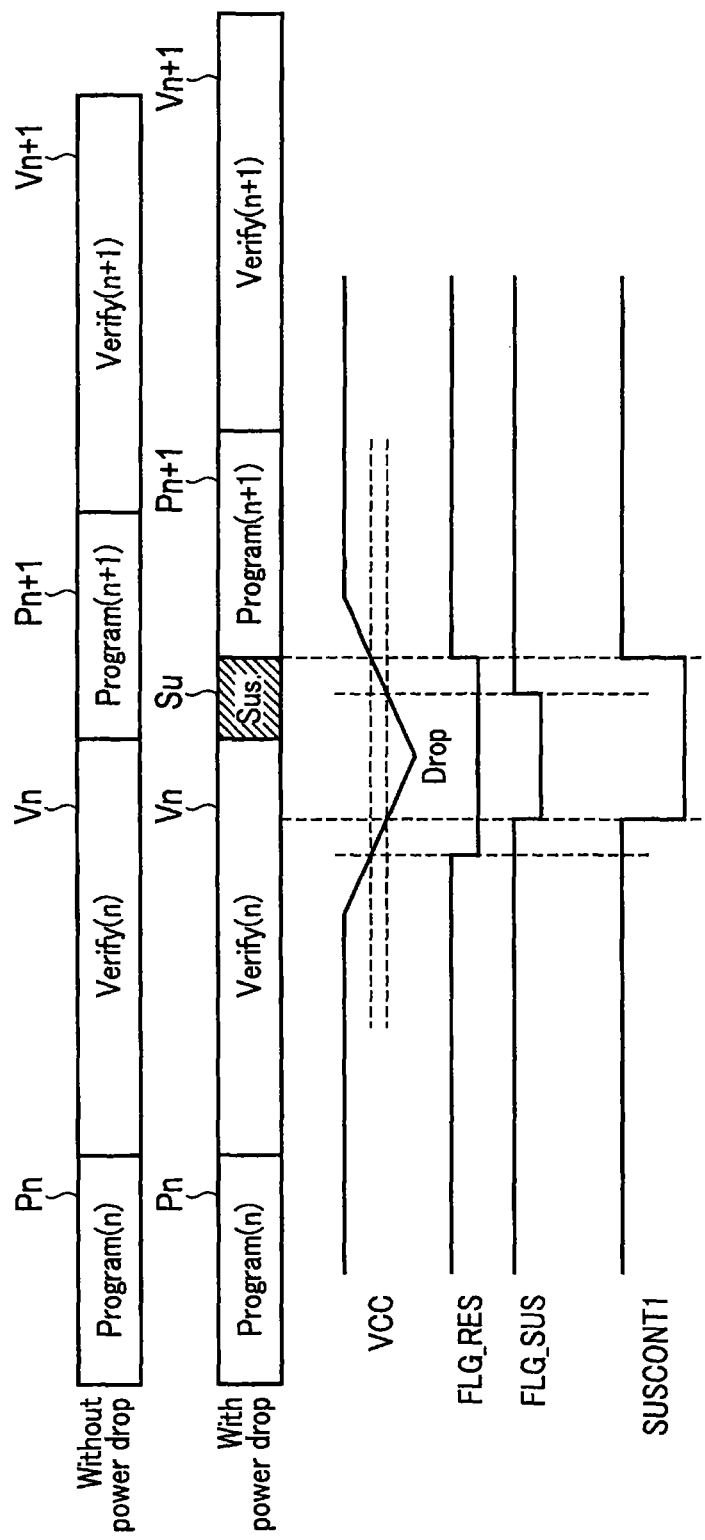
FIG. 5 is a timing chart of a write operation according to a comparative example.

In this comparative example as well as in the comparative example shown in FIG. 5, if the power voltage VCC drops during the sense period in the program verification, the program verification is not properly performed, and a misjudgment may result. In this case, an over-program or erroneous writing occurs.

In contrast, in the second embodiment, when a drop and the recovery of the power voltage VCC are detected during the program verification, the program verification is again executed for the same address after the end of the program verification. Thus, the program can be executed in accordance with the correct judgment by the program verification after the recovery of the power voltage VCC.

As described above, according to the first and second embodiments, when there is a power drop of the power voltage during the sense period in the program verification (loop n), the program verification (loop n) is again executed to perform proper sensing after the recovery of the power voltage (after the end of the suspend mode). Thus, it is possible to prevent an over-program or erroneous writing caused by erroneous sensing resulting from the power drop, and improve the reliability of the write operation.

(Details of Program and Program Verification)

Figure 8:
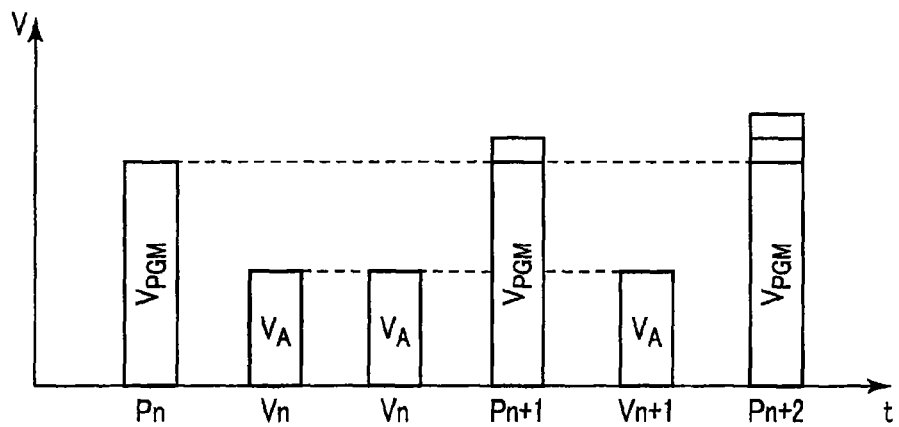
FIGS. 8 and 9 are diagrams showing a program and a program verification in a write operation according to the first and second embodiments.

Details of a program and a program verification in the write operation according to the first and second embodiments are described below. An operation of writing into a memory cell (single-level cell: SLC) capable of storing 1-bit data is shown in FIG. 8. A voltage applied to a selected word line during a program verification of data "0" in 1-bit data ("1", "0") is referred to as VA. Here, a suspend period is omitted.

As shown in FIG. 8, first, a program Pn and a program verification Vn corresponding to a loop n are executed. In the program Pn, the write voltage VPGM is applied to the selected word line. Then in the program verification Vn, a verification voltage VA is applied to the selected word line. When the power voltage VCC has become lower than a desired voltage during the period of this program verification Vn, there is a wait before the power voltage VCC recovers to a voltage equal to or more than the desired voltage (suspend mode). After the power voltage VCC has recovered, the program verification Vn for the memory cell is repeated. That is, the verification voltage VA is again applied to the selected word line. In accordance with the result of the repeated program verification Vn, whether to execute a program Pn+1 corresponding to a next loop n+1 or move to a loop for the next memory cell targeted for writing is then determined. In the case shown here, the program Pn+1 and the program verification Vn+1 corresponding to the loop n+1 are executed.

Figure 9:
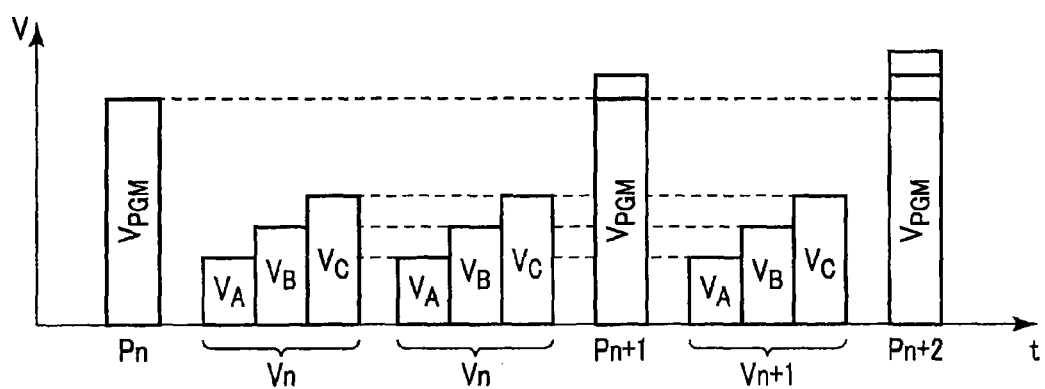

Next, an operation of writing into a memory cell (multi-level cell: MLC) capable of storing 2-bit data is shown in FIG. 9. Voltages applied to a selected word line during A-level, B-level, and C-level program verifications in 2-bit data (e.g. "11", "10" (A-level), "00" (B-level), and "01" (C-level)) are referred to as VA, VB, and VC, respectively. Here again, a suspend period is also omitted.

As shown in FIG. 9, first, a program Pn and a program verification Vn corresponding to a loop n are executed. In the program Pn, the write voltage VPGM is applied to the selected word line. Then in the program verification Vn, verification voltages VA, VB, and VC are applied to the selected word line. When the power voltage VCC has become lower than a desired voltage during the period of this program verification Vn, there is a wait before the power voltage VCC recovers to a voltage equal to or more than the desired voltage (suspend mode). After the power voltage VCC has recovered, the program verification Vn for the memory cell is repeated. That is, the verification voltages VA, VB, and VC are again applied to the selected word line. In accordance with the result of the repeated program verification Vn, whether to execute a program Pn+1 corresponding to a next loop n+1 or move to a loop for the next memory cell targeted for writing is then determined. In the case shown here, the program Pn+1 and the program verification Vn+1 corresponding to the loop n+1 are executed.

Modifications, Etc.

Although the NAND flash memory has been described as an example of the nonvolatile semiconductor memory device in the first and second embodiments, the nonvolatile semiconductor memory device is not limited thereto. The nonvolatile semiconductor memory device is applicable to various kinds of semiconductor memory devices having the program verification whether it is a volatile memory or a nonvolatile memory.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A nonvolatile semiconductor memory device comprising:
    a first memory cell; and
    a controller which controls a write operation,
    wherein the write operation includes a first program to write data into the first memory cell, and a first verification to verify the first program, and
    when a power voltage has become lower than a first voltage during the execution of the first verification for the first memory cell,
    the controller executes a second verification to verify the first program for the first memory cell.

2. The nonvolatile semiconductor memory device according to claim 1, wherein
    the controller executes the second verification after detecting that the power voltage has recovered to the first voltage or more.

3. The nonvolatile semiconductor memory device according to claim 1, wherein
    the controller shifts to a suspend mode to suspend the write operation after the end of the first verification, and
    the controller shifts to the second verification from the suspend mode when detecting that the power voltage has recovered to the first voltage or more.

4. The nonvolatile semiconductor memory device according to claim 1, wherein the controller detects that the power voltage has become lower than the first voltage during a sense period in the first verification.

5. The nonvolatile semiconductor memory device according to claim 4, wherein
the sense period includes a period in which data is read and transferred from the first memory cell.

6. The nonvolatile semiconductor memory device according to claim 1, further comprising
a second memory cell,
wherein the controller determines whether to perform a program for the first memory cell or the second memory cell in accordance with the judgment result by the second verification.

7. The nonvolatile semiconductor memory device according to claim 6, wherein
the controller executes a program for the second memory cell when the second verification has been passed.

8. The nonvolatile semiconductor memory device according to claim 6, wherein
the controller executes a program for the first memory cell when the second verification has failed.

9. The nonvolatile semiconductor memory device according to claim 1, wherein
the first voltage is a voltage at which the voltage level of the power voltage is 50% or more.

10. The nonvolatile semiconductor memory device according to claim 1, wherein
the first voltage is an operation guarantee voltage.

11. The nonvolatile semiconductor memory device according to claim 1, wherein
the power voltage is a power source supplied from the outside.

12. The nonvolatile semiconductor memory device according to claim 1, wherein
the controller executes the second verification after detecting that the power voltage has recovered to the first voltage or more during the first verification.

13. The nonvolatile semiconductor memory device according to claim 12, wherein
the controller shifts to the second verification after the end of the first verification.

14. The nonvolatile semiconductor memory device according to claim 12, wherein
the controller detects that the power voltage has become lower than the first voltage and that the power voltage has recovered to the first voltage or more during a sense period in the first verification.

15. The nonvolatile semiconductor memory device according to claim 14, wherein
the sense period is a period in which data is read and transferred from the first memory cell.

16. The nonvolatile semiconductor memory device according to claim 1, wherein
the second verification is a verification having the same conditions as the first verification.

17. A nonvolatile semiconductor memory device comprising:
a first memory cell;
a detector configured to detect that a power voltage has become lower than a first voltage at which a write operation is normally performed; and
a controller configured to control the write operation in response to an output of the detector,
wherein the write operation includes a program to write data into the first memory cell, and a verification to verify the program, and
when the detector detects that the power voltage has become lower than the first voltage during a first verification for the first memory cell,
the controller executes a second verification for the first memory cell without undergoing the program to write data in the first memory cell after detecting that the power voltage has recovered to the first voltage or more.

18. The nonvolatile semiconductor memory device according to claim 17, wherein
the second verification is a verification having the same conditions as the first verification.

19. The nonvolatile semiconductor memory device according to claim 18, wherein
the controller executes a program for the first memory cell when the second verification has failed.

20. The nonvolatile semiconductor memory device according to claim 18, wherein
the controller executes a program for a second memory cell different from the first memory cell when the second verification has been passed.

* * * * *